US011063240B2

United States Patent
Oh et al.

(10) Patent No.: US 11,063,240 B2
(45) Date of Patent: *Jul. 13, 2021

(54) DISPLAY DEVICE HAVING A BUFFER LAYER COMPRISING A PLURALITY OF SUB LAYERS AND INTERFACES

(71) Applicant: Samsung Display Co., Ltd., Yongin-si (KR)

(72) Inventors: Minho Oh, Yongin-si (KR); Jongwoo Kim, Yongin-si (KR); Jiyoung Moon, Yongin-si (KR); Seungjae Lee, Yongin-si (KR); Yoonhyeung Cho, Yongin-si (KR); Youngcheol Joo, Yongin-si (KR); Jaeheung Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,187

(22) Filed: May 23, 2019

(65) Prior Publication Data

US 2019/0288235 A1    Sep. 19, 2019

Related U.S. Application Data

(62) Division of application No. 15/334,181, filed on Oct. 25, 2016, now Pat. No. 10,347,868.

(30) Foreign Application Priority Data

Mar. 8, 2016 (KR) .......................... 10-2016-0027699

(51) Int. Cl.
*H01L 51/52* (2006.01)
*G02F 1/1362* (2006.01)
(Continued)

(52) U.S. Cl.
CPC ........ *H01L 51/5253* (2013.01); *G02F 1/1362* (2013.01); *H01L 27/1248* (2013.01);
(Continued)

(58) Field of Classification Search
CPC ...................... H01L 51/5253; H01L 27/1248; G02F 1/1362
See application file for complete search history.

(56) References Cited

U.S. PATENT DOCUMENTS 6,268,695 B1    7/2001    Affinito
6,413,645 B1    7/2002    Graff et al.
(Continued)

FOREIGN PATENT DOCUMENTS

CN    101459193 A    6/2009
CN    104332483 A    2/2015
(Continued)

OTHER PUBLICATIONS

Favia, P., et al., "Plasma and surface diagnostics in PECVD from silicon containing organic monomers," Pure and Applied Chemistry, 1994, vol. 66, No. 6, pp. 1373-1380.
(Continued)

*Primary Examiner* — Lex H Malsawma
*Assistant Examiner* — Xia L Cross
(74) *Attorney, Agent, or Firm* — Lewis Roca Rothgerber Christie LLP

(57) ABSTRACT

A display device includes a display substrate including at least one step portion, and a thin film encapsulation layer above the display substrate, the thin film encapsulation layer including a buffer layer configured to reduce a height difference due to the at least one step portion and a barrier layer above the buffer layer, the buffer layer including a plurality of sub-layers and interfaces between the plurality of sub-layers, and the interfaces including a curved surface changing from a concave shape to a convex shape toward a (Continued)

portion overlapping the step portion from an outer portion of the step portion.

15 Claims, 9 Drawing Sheets

(51) Int. Cl.
    *H01L 27/12*     (2006.01)
    *H01L 27/32*     (2006.01)
    *H01L 51/56*     (2006.01)
    *H01L 29/786*     (2006.01)
    *G02F 1/1333*     (2006.01)

(52) U.S. Cl.
    CPC ...... *H01L 27/3246* (2013.01); *H01L 27/3276* (2013.01); *H01L 29/786* (2013.01); *H01L 51/5256* (2013.01); *H01L 51/56* (2013.01); *G02F 1/133357* (2021.01); *G02F 2201/44* (2013.01); *G02F 2201/48* (2013.01); *G02F 2201/501* (2013.01); *H01L 2227/323* (2013.01)

(56) References Cited

U.S. PATENT DOCUMENTS

| | | | |
|---|---|---|---|
| 6,593,655 B1* | 7/2003 | Loboda | ........... C23C 16/30 257/760 |
| 7,936,122 B2* | 5/2011 | Izumi | ........... H01L 51/5253 313/504 |
| 8,461,760 B1 | 6/2013 | Oh et al. | |
| 10,032,835 B2 | 7/2018 | Min et al. | |
| 2011/0097533 A1 | 4/2011 | Li et al. | |
| 2014/0024180 A1 | 1/2014 | Choi et al. | |
| 2014/0065739 A1 | 3/2014 | Chen et al. | |
| 2014/0246655 A1 | 9/2014 | Chen | |
| 2014/0256070 A1 | 9/2014 | Chen et al. | |
| 2014/0291621 A1* | 10/2014 | Kim | ........... H01L 51/5256 257/40 |
| 2014/0299859 A1 | 10/2014 | Chen et al. | |
| 2014/0349422 A1 | 11/2014 | Chen et al. | |
| 2015/0014663 A1* | 1/2015 | Kwak | ........... H01L 51/5253 257/40 |
| 2016/0043340 A1* | 2/2016 | Ohara | ........... H01L 51/5253 257/40 |

FOREIGN PATENT DOCUMENTS

| | | |
|---|---|---|
| CN | 105374848 A | 3/2016 |
| KR | 10-2004-0063275 A | 7/2004 |
| KR | 10-2013-0128689 A | 11/2013 |
| KR | 10-2014-0087470 A | 7/2014 |
| KR | 10-2014-0147615 A | 12/2014 |
| KR | 10-2015-0052244 A | 5/2015 |

OTHER PUBLICATIONS

Yoshimura, M., et al., "Oxidation of $Si_3N_4$ and SiC by High Temperature—High Pressure Water Vapor," Hydrothermal Reactions for Materials Science and Engineering, pp. 450-457.

EPO Extended Search Report dated Aug. 4, 2017, for corresponding European Patent Application No. 17155498.3 (1 page).

* cited by examiner

DISPLAY DEVICE HAVING A BUFFER LAYER COMPRISING A PLURALITY OF SUB LAYERS AND INTERFACES

CROSS-REFERENCE TO RELATED APPLICATION

This application is a divisional of U.S. patent application Ser. No. 15/334,181, filed Oct. 25, 2016, which claims priority to and the benefit of Korean Patent Application No. 10-2016-0027699, filed on Mar. 8, 2016, in the Korean Intellectual Property Office, the disclosure of all of which is incorporated herein in its entirety by reference.

BACKGROUND

1. Field

Aspects of the present invention relate to a display device.

2. Description of the Related Art

As a display field visually expressing various kinds of electric signal information develops rapidly, various flat panel display devices having excellent characteristics, such as a slim profile, a light weight, and low power consumption are introduced, and furthermore, flexible display devices are being researched and developed.

A display device having a slim profile and a flexible characteristic may include a thin film encapsulation layer in order to block penetration of moisture, oxygen, and/or the like from outside. A general thin film encapsulation layer has a configuration in which inorganic layers and organic layers are alternately stacked. However, because the organic layer and the inorganic layer are manufactured via different processes in different chambers, a process of manufacturing the thin film encapsulation layer is complicated and impurities may be introduced into the thin film encapsulation layer during transfer between the chambers, causing the thin film encapsulation layer to become damaged.

SUMMARY

Aspects of some embodiments of the present invention are directed to a display device that includes a thin film encapsulation layer having desirable (e.g., excellent) characteristics, such as a slim profile, a light weight, and low power consumption, and which is manufactured by a simple process.

Additional aspects will be set forth in part in the description which follows and, in part, will be apparent from the description, or may be learned by practice of the presented embodiments.

According to one or more embodiments of the present invention, there is provided a display device including: a display substrate including at least one step portion; and a thin film encapsulation layer above the display substrate, the thin film encapsulation layer including a buffer layer configured to reduce a height difference due to the at least one step portion and a barrier layer above the buffer layer, the buffer layer including a plurality of sub-layers and interfaces between the plurality of sub-layers, and the interfaces including a curved surface changing from a concave shape to a convex shape toward a portion overlapping the step portion from an outer portion of the step portion.

In an embodiment, each of the plurality of sub-layers has a thickness from about 300 Å to about 10000 Å.

In an embodiment, an interval between two adjacent interfaces of the interfaces increases toward the display substrate in the outer portion of the step portion.

In an embodiment, an interval between two adjacent interfaces of the interfaces reduces toward a portion overlapping the step portion from the outer portion of the step portion.

In an embodiment, the buffer layer has a first thickness at a location spaced from the step portion and has a second thickness at a location overlapping the step portion, and wherein the second thickness is about 0.5 times or more than and less than about one times the first thickness.

In an embodiment, the plurality of sub-layers include a silicon oxide including carbon and hydrogen, and each of the plurality of sub-layers includes about 20 to about 50 atomic % of silicon, about 10 to about 40 atomic % of oxygen, and about 30 to about 60 atomic % of carbon based on a total number of atoms of the silicon, the oxygen, and the carbon.

In an embodiment, each of the plurality of sub-layers includes a first region and a second region above the first region, an upper surface of the second region forming an interface of the interfaces, and the second region has a silicon content ratio greater than that of the first region, and the second region has a carbon content ratio less than that of the first region.

In an embodiment, each of the plurality of sub-layers includes about 30 to about 40 atomic % of the silicon, about 18 to about 28 atomic % of the oxygen, and about 40 to about 50 atomic % of the carbon based on a total number of atoms of the silicon, the oxygen, and the carbon.

In an embodiment, each of the plurality of sub-layers includes about 33 to about 36 atomic % of the silicon, about 20 to about 23 atomic % of the oxygen, and about 42 to about 45 atomic % of the carbon based on a total number of atoms of the silicon, the oxygen, and the carbon.

In an embodiment, the display substrate includes a base substrate and a display portion above the base substrate, the display portion includes a plurality of display elements and a pixel-defining layer defining a light-emitting region of the plurality of display elements, and the at least one step portion includes the pixel-defining layer.

In an embodiment, the display device further includes a protective layer above the display portion, the protective layer including a same material as that of the buffer layer.

In an embodiment, each of the plurality of display elements includes a first electrode, a second electrode, and an intermediate layer between the first and second electrodes, the intermediate layer including an organic emission layer, and the display substrate further includes a capping layer between the first electrode and the protective layer, the capping layer having a refractive index greater than that of the protective layer.

In an embodiment, the protective layer has a refractive index from about 1.38 to about 1.5.

In an embodiment, the protective layer further includes silicon carbide to which hydrogen is coupled.

In an embodiment, the thin film encapsulation layer is configured to seal the display portion, the barrier layer includes a first barrier layer and a second barrier layer overlapping each other with the buffer layer therebetween, and the first and second barrier layers include an inorganic layer.

In an embodiment, the first and second barrier layers contact each other at an outer portion of the buffer layer.

According to one or more embodiments of the present invention, there is provided a method of manufacturing a display device, the method including: forming a display portion above a base substrate; and forming a thin film encapsulation layer sealing the display portion, the forming of the thin film encapsulation layer including: injecting a raw gas and a reaction gas inside a chamber in which the base substrate is located, depositing a precursor layer above the base substrate by utilizing plasma-enhanced chemical vapor deposition, and forming a sub-layer by curing the precursor layer utilizing plasma; forming a plurality of sub-layers and forming a buffer layer in which the plurality of sub-layers are stacked; and forming a barrier layer above the buffer layer inside the chamber, wherein the plurality of sub-layers include a silicon oxide including carbon and hydrogen, and wherein each of the plurality of sub-layers include about 20 to about 50 atomic % of silicon, about 10 to about 40 atomic % of oxygen, and about 30 to about 60 atomic % of carbon based on a total number of atoms of the silicon, the oxygen, and the carbon.

In an embodiment, the raw gas includes hexamethyldisiloxane, and the reaction gas includes oxygen, nitrous oxide, and/or hydrogen.

In an embodiment, the buffer layer includes interfaces between the plurality of sub-layers, each of the plurality of sub-layers includes a first region and a second region above the first region, an upper surface of the second region forming an interface of the interfaces, the second region has a silicon content ratio greater than that of the first region, and the second region has a carbon content ratio less than that of the first region.

In an embodiment, each of the plurality of sub-layers includes about 30 to about 40 atomic % of the silicon, about 18 to about 28 atomic % of the oxygen, and about 40 to about 50 atomic % of the carbon based on a total number of atoms of the silicon, the oxygen, and the carbon.

In an embodiment, each of the plurality of sub-layers includes about 33 to about 36 atomic % of the silicon, about 20 to about 23 atomic % of the oxygen, and about 42 to about 45 atomic % of the carbon based on a total number of atoms of the silicon, the oxygen, and the carbon.

In an embodiment, the display portion includes at least one step portion above a surface thereof, and the buffer layer has a first thickness at a location spaced from the step portion and a second thickness at a location overlapping the step portion, the second thickness being about 0.5 times or more than and less than about one times the first thickness.

In an embodiment, the interfaces are formed in a curved surface changing from a concave shape to a convex shape toward a portion overlapping the step portion from an outer portion of the step portion.

In an embodiment, an interval between two adjacent interfaces of the interfaces increases toward the display portion in an outer portion of the step portion.

In an embodiment, an interval between two adjacent interfaces of the interfaces reduces toward a portion overlapping the step portion from an outer portion of the step portion.

In an embodiment, each of the plurality of sub-layers has a thickness from about 300 Å to about 10000 Å.

In an embodiment, the method further includes: before the forming of the thin film encapsulation layer, forming a protective layer above the display portion, wherein the protective layer includes a same material as that of the sub-layer and being formed by utilizing a same method as the sub-layer, and wherein flux of oxygen introduced into the chamber while the protective layer is formed is greater than that of oxygen introduced into the chamber while the sub-layer is formed.

In an embodiment, the protective layer further includes silicon carbide to which hydrogen is coupled.

In an embodiment, the protective layer has a refractive index from about 1.38 to about 1.5.

In an embodiment, the display portion includes a plurality of display elements, each including a first electrode, a second electrode, and an intermediate layer between the first and second electrodes, the intermediate layer including an organic emission layer, and wherein the display device includes a capping layer between the second electrode and the protective layer, the capping layer having a refractive index greater than that of the protective layer.

Thus, according to some embodiments of the present invention, a thin film encapsulation layer includes a buffer layer, so that a barrier layer may be prevented or substantially prevented from being damaged by a step difference caused by impurities, and/or the like, and thus a characteristic of the thin film encapsulation layer may improve. Also, because the buffer layer and the barrier layer are manufactured by the same process, manufacturing efficiency of a display device may improve (e.g., increase). As understood by a person of ordinary skill in the art, the scope of the inventive concept is not limited by this effect.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
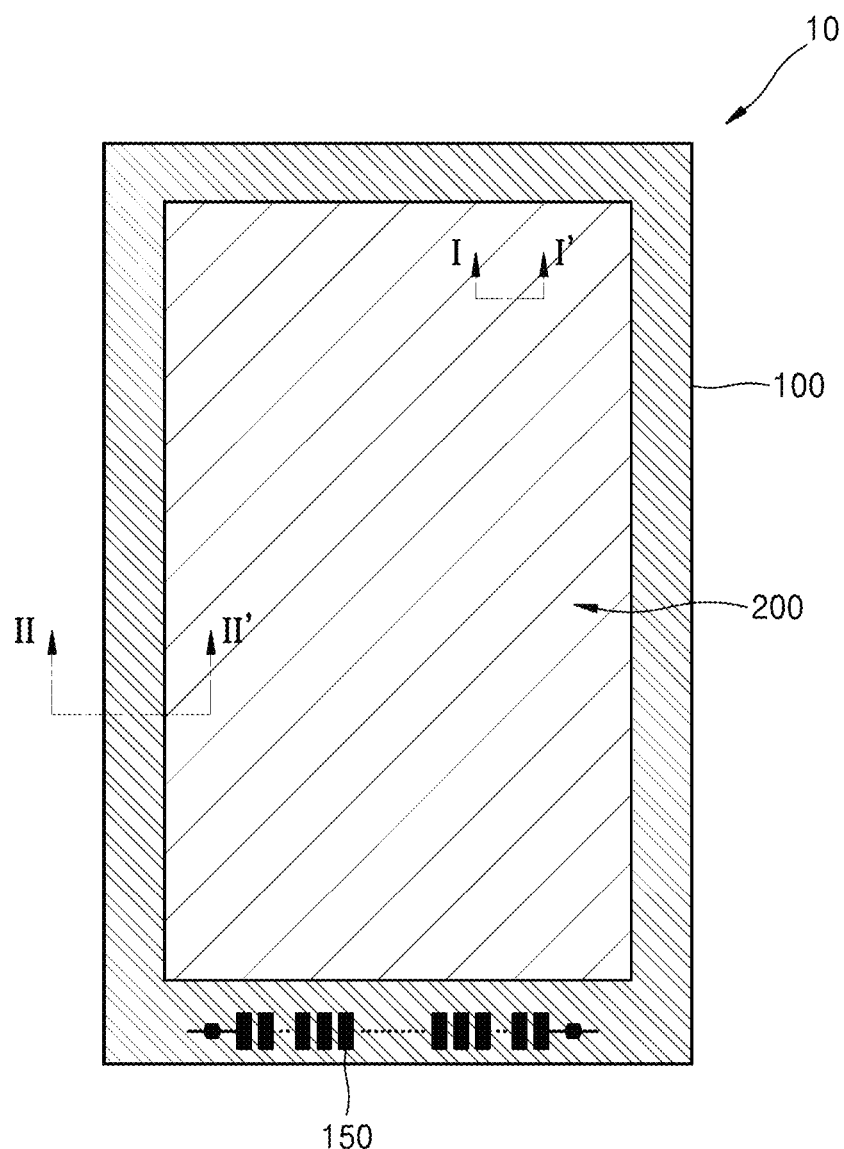
FIG. 1 is a plan view illustrating a display device according to an embodiment of the present invention.

As the inventive concept allows for various suitable changes and numerous embodiments, exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the description of the inventive concept, certain detailed explanations of the related art are omitted when it is deemed that they may unnecessarily obscure the essence of the inventive concept.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof may be omitted.

Figure 2:
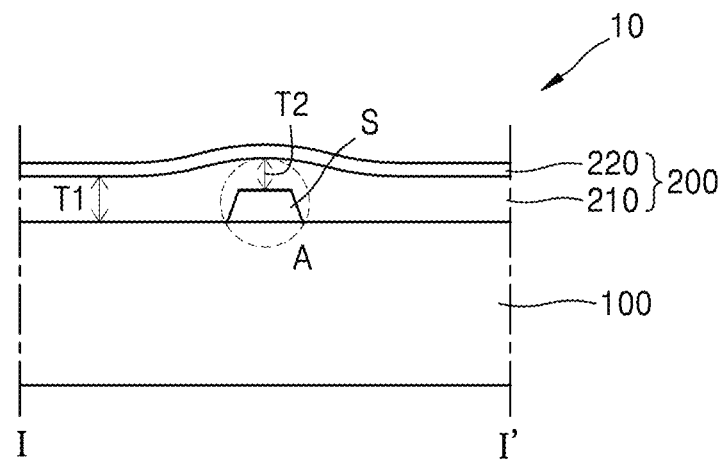
FIG. 2 is a cross-sectional view illustrating an example of a portion of the display device taken along the line I-I' of FIG. 1.
Figure 3:
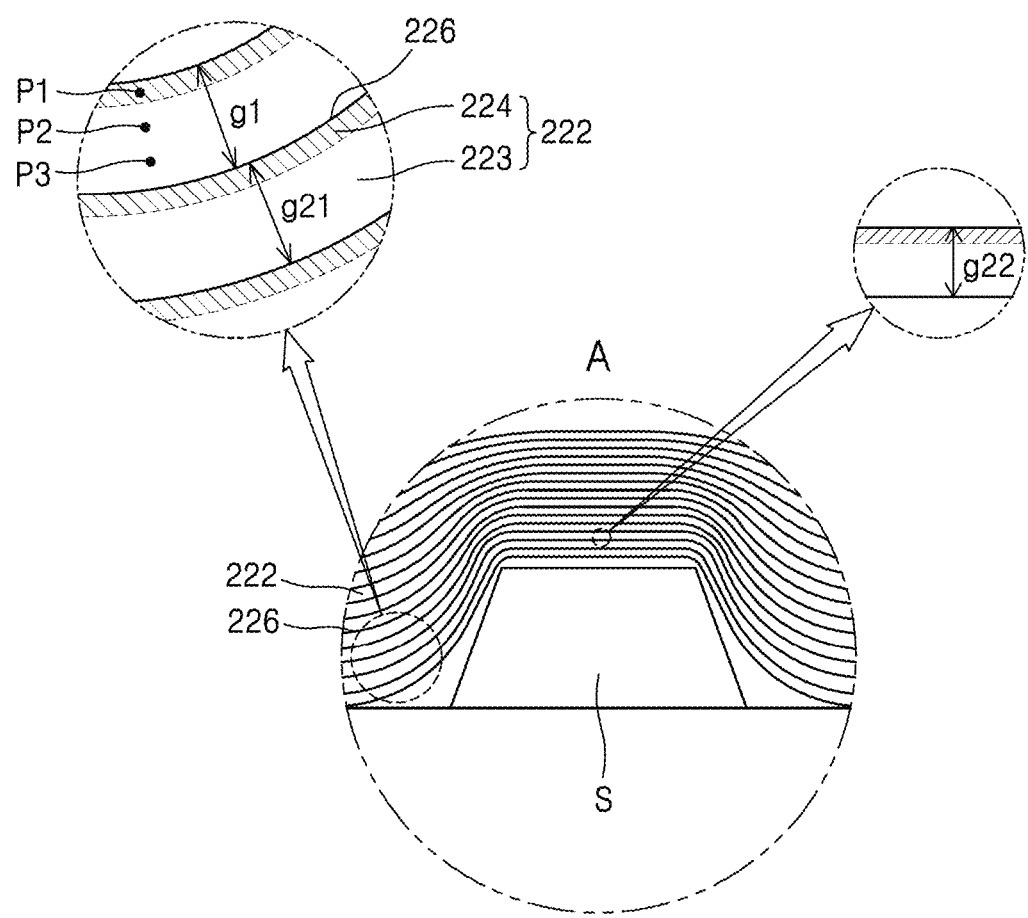
FIG. 3 is a magnified view illustrating a portion A of the display device of FIG. 2.
Figure 4:
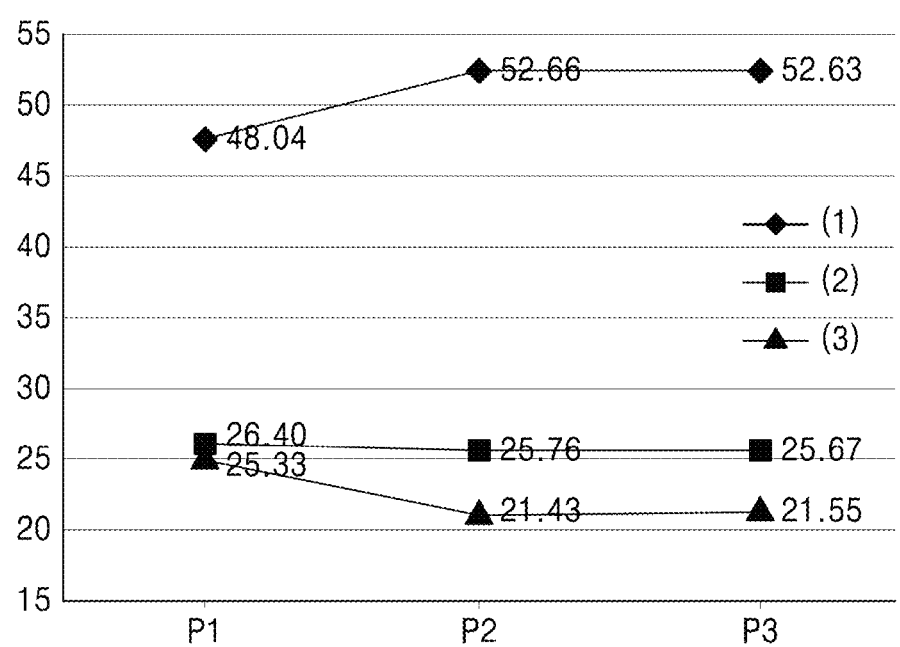
FIG. 4 is a graph illustrating composition of a sub-layer versus a location of the sub-layer of FIG. 3.

FIG. 1 is a plan view illustrating a display device 10 according to an embodiment of the present invention; FIG. 2 is a cross-sectional view illustrating an example of a portion of the display device 10 taken along the line I-I' of FIG. 1; FIG. 3 is a magnified view illustrating a portion A of the display device 10 of FIG. 2; and FIG. 4 is a graph illustrating composition of a sub-layer versus a location of the sub-layer of FIG. 3.

Referring to FIGS. 1 to 4, the display device 10 according to an embodiment may include a display substrate 100 and a thin film encapsulation layer 200 above the display substrate 100. The thin film encapsulation layer 200 may include a buffer layer 210 and a barrier layer 220.

The display substrate 100 may produce an image by including a plurality of display elements. The display substrate 100 may include various suitable kinds of display elements, such as an organic light-emitting diode (OLED), a light-emitting diode (LED), and a liquid crystal display (LCD). Also, the display substrate 100 may include, on one side, a pad portion 150 for transferring an electric signal from a power supply or a signal generator to the plurality of display elements.

The display substrate 100 may include at least one step portion S. The step portion S may result from the structure of the display substrate 100 or may be formed due to a particle, and/or the like on the surface of the display substrate 100.

The step portion S induces a height difference in the surface of the display substrate 100, and when external force is applied to the display substrate 100, stress concentrates on the step portion S, so that damage, such as cracks, to the thin film encapsulation layer 200, for example, the barrier layer 220 above the step portion S may occur. Also, where a contact angle between the step portion S and the display substrate 100 is small (e.g., forms an acute angle, such as where the step portion S has an inversely tapered shape or the step portion S is formed by particles), the thin film encapsulation layer 200 does not completely fill a space between the step portion S and the display substrate 100, and thus an air gap, and/or the like may be generated between the display substrate 100 and the thin film encapsulation layer 200. To prevent or substantially prevent the formation of the air gap, the thin film encapsulation layer 200 formed above the display substrate 100 may include the buffer layer 210.

The buffer layer 210 may prevent or substantially prevent damage of the barrier layer 220 due to concentration of stress by a step difference, or when external force is applied, by reducing the step difference of the step portion S. The buffer layer 210 completely surrounds the step portion S, thereby preventing or substantially preventing an air gap from being generated between the display substrate 100 and the thin film encapsulation layer 200 even where a contact angle between the step portion S and the display substrate 100 forms an acute angle. Also, the buffer layer 210 may reduce the stress formed on the barrier layer 220.

The buffer layer 210 may include a plurality of stacked sub-layers 222. The plurality of sub-layers 222 are layers that may be distinguished from (e.g., discriminated from) each other. Interfaces 226 may be between the plurality of sub-layers 222.

The plurality of sub-layers 222 may include a silicon oxide including carbon and hydrogen. For example, the plurality of sub-layers 222 may include a material having an empirical formula of $SiO_xC_yH_z$. In this case, when a composition ratio of x increases, the plurality of sub-layers 222 may have properties close to an inorganic layer. When a composition ratio of y increases, the plurality of sub-layers 222 may have properties close to an organic layer.

If the composition ratio of x is excessively large, because the plurality of sub-layers 222 are formed conformally, a step difference (e.g., a step height) of the step portion S may be difficult to reduce, and where a contact angle between the step portion S and the display substrate 100 is small, an air gap may be generated between the display substrate 100 and the thin film encapsulation layer 200. However, if the composition ratio of y is excessively large, because a precursor layer for forming the sub-layer 222 has high liquidity, it may be difficult to form the sub-layers 222 having a constant thickness above the step portion S. Additionally, when the thickness of the buffer layer 210 is equal to or less than the thickness of the step portion S, if the composition ratio of y is excessively large, the buffer layer 210 may not sufficiently cover the upper portion of the step portion S, and thus, the barrier layer 220 may be damaged by the step portion S.

Therefore, even where the buffer layer 210 has excellent step coverage and a contact angle between the step portion S and the display substrate 100 is small, to prevent or substantially prevent generation of an air gap between the display substrate 100 and the thin film encapsulation layer 200, each of the plurality of sub-layers 222 may include about 20 to about 50 atomic % of silicon, about 10 to about 40 atomic % of oxygen, and about 30 to about 60 atomic % of carbon based on a total number of atoms of the silicon, the oxygen, and the carbon. In an embodiment, each of the plurality of sub-layers 222 may include about 30 to about 40 atomic % of silicon, about 18 to about 28 atomic % of oxygen, and about 40 to about 50 atomic % of carbon. In another embodiment, each of the plurality of sub-layers 222 may include about 33 to about 36 atomic % of silicon, about 20 to about 23 atomic % of oxygen, and about 42 to about 45 atomic % of carbon. In this case, a ratio of oxygen to silicon (O/Si) may be about 0.4 or more and about 1 or less.

Each of the plurality of sub-layers 222 may have a thickness ranging from about 300 Å to about 10000 Å. When the thickness of each of the plurality of sub-layers 222 is less than 300 Å, the plurality of sub-layers 222 cured by plasma have properties close to an inorganic layer as a whole, and the hardness of the plurality of sub-layers 222 increases, thus it may be difficult to distribute stress generated to the barrier layer 220. However, when the thickness of each of the plurality of sub-layers 222 is greater than 10000 Å, the sub-layers 222 may have an uncured portion therein and have an excessively soft characteristic, so that wrinkles may occur in the plurality of sub-layers 222 and thus the thin film encapsulation layer 200 has a haze characteristic, which may affect the display quality of the display device 10.

The plurality of sub-layers 222 completely surround the step portion S. In this case, the interfaces 226 may include a curved surface changing from a concave shape to a convex shape toward a location overlapping the step portion S from the outer portion of the step portion S. Here, the concave shape denotes a shape bending toward the display substrate 100, and the convex shape denotes a shape bending away from (e.g., toward the opposite side of) the display substrate 100. Curvature radii having the concave shape and the convex shape of the interfaces 226 may gradually increase the further away they are from the display substrate 100.

For example, in the outer portion of the step portion S, intervals (e.g., gaps or distances) g1 and g21 between two adjacent interfaces 226 from among the interfaces 226 may increase (g21>g1) toward the display substrate 100. Intervals g21 and g22 between two adjacent interfaces 226 from among the interfaces 226 may reduce (g21>g22) toward a location overlapping the step portion S from the outer portion of the step portion S. Here, the intervals g1 and g21 between the interfaces 226 at the outer portion of the step portion S may denote a maximum interval between concave shapes of the interfaces 226.

That is, a difference between the thickness g21 at the outer portion of the step portion S and the thickness g22 at a location overlapping the step portion S in one sub-layer 222 increases toward the display substrate 100 and as the height of the step portion S increases. The difference may gradually reduce as the sub-layers 222 are stacked. Therefore, initially stacked sub-layers 222 may completely cover the surface of the step portion S, and fill a gap between the step portion S and the display substrate 100. As the sub-layers 222 are stacked, a step difference (e.g., a step height) of the step portion S reduces and the upper surface of the buffer layer 210 may be planarized or substantially planarized. Also, the buffer layer 210 has a first thickness T1 at a location spaced apart from the step portion S and a second thickness T2 at a location overlapping the step portion S. In this case, the second thickness T2 may be about 0.5 times or more than, and less than one times, the thickness T1.

Each of the plurality of sub-layers 222 may include a first region 223 and a second region 224 successively above the first region 223 and including an upper surface forming the interface 226. The second region 224 is formed while a precursor layer for forming the sub-layer 222 is cured and may have a thickness ranging from about 50 Å to about 1500 Å.

The second region 224 may have a composition different from that of the first region 223. FIG. 4 illustrates results obtained by measuring the content of carbon 1, oxygen 2, and silicon 3 included in the sub-layer 222 at a first location P1, a second location P2, and a third location P3 of FIG. 3 by using x-ray photoelectron spectroscopy (XPS). Referring to FIG. 4, it is shown that the content of the silicon 3 at the first location P1 is greater than the content of the silicon 3 at the second and third locations P2 and P3, and the content of the carbon 1 at the first location P1 is less than the content of the carbon 1 at the second and third locations P2 and P3. That is, because a content ratio of the silicon 3 of the second region 224 is greater than a content ratio of the silicon 3 of the first region 223 and a content ratio of the carbon 1 of the second region 224 is less than a content ratio of the carbon 1 of the first region 223, the second region 224 may have properties close to an inorganic layer compared to the first region 223. Therefore, because the buffer layer 210 has a structure in which the first region 223 and the second region 224 having different properties have a small thickness and are multi-layered, moisture and oxygen-blocking characteristics improve and excellent flexibility may be obtained.

The thin film encapsulation layer 200 includes the barrier layer 220 above the buffer layer 210. The barrier layer 220 blocks penetration of external moisture and oxygen, may be larger than the buffer layer 210, may cover the upper surface and the lateral surfaces of the buffer layer 210, and contact the display substrate 100 at the outer portion of the buffer layer 210.

The barrier layer 220 may include silicon nitride, aluminum nitride, zirconium nitride, titanium nitride, hafnium nitride, tantalum nitride, silicon oxide, aluminum oxide, titanium oxide, tin oxide, cesium oxide, silicon oxynitride (SiON), and/or the like.

Figure 5:
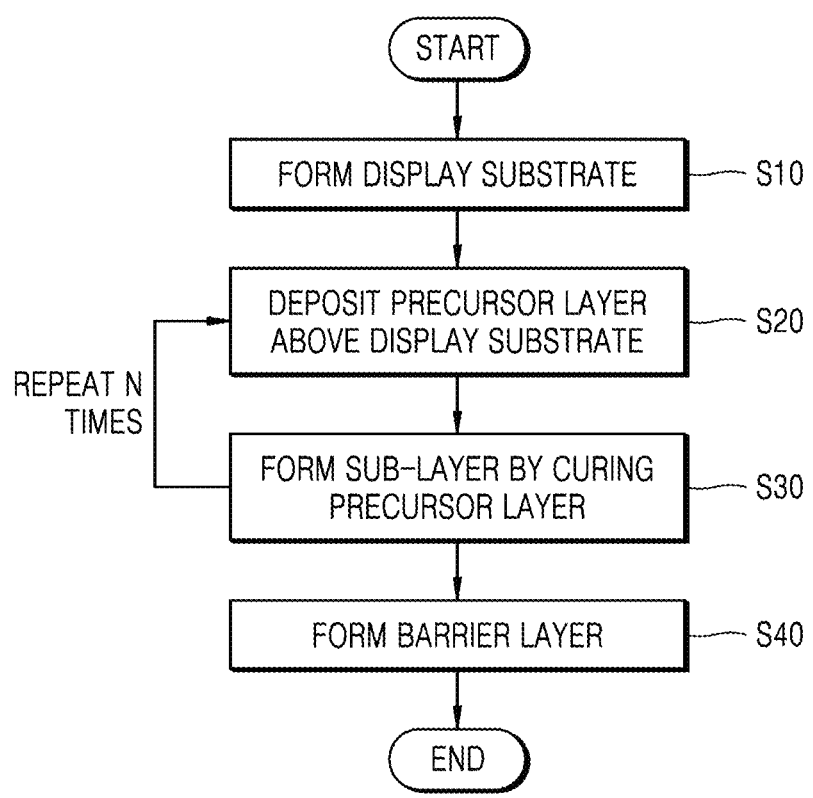
FIG. 5 is a flow diagram illustrating a process of manufacturing a display device of FIG. 1.
Figure 6:
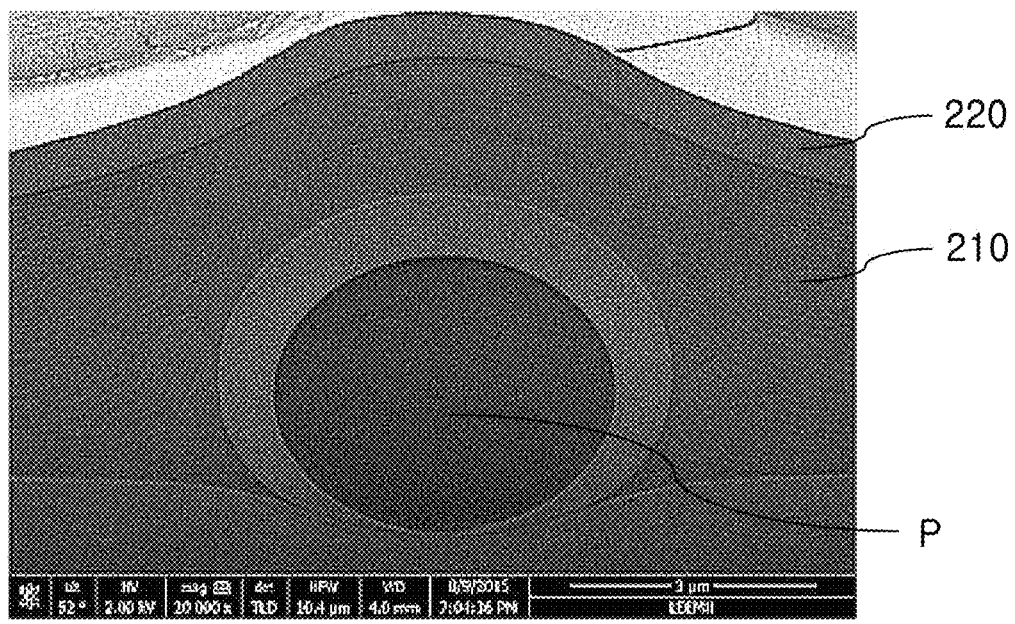
FIG. 6 is a cross-sectional view illustrating another example of the portion of the display device taken along the line I-I' of FIG. 1.

FIG. 5 is a flow diagram illustrating a method of manufacturing the display device 10 of FIG. 1; and FIG. 6 is a cross-sectional view illustrating another example of the portion of the display device 10 taken along the line I-I' of FIG. 1.

Referring to FIGS. 1 to 3 and 5, the method of manufacturing the display device 10 may include forming the display substrate 100 (S10) and forming the thin film encapsulation layer 200 above the display substrate 100 (S20 to S40).

As described below with reference to FIG. 7, the display substrate 100 includes a base substrate 101 (see, e.g., FIG. 7) and a display portion 110 (see, e.g., FIG. 7) formed above the base substrate 101. The display substrate 100 is described below with reference to FIG. 7.

The thin film encapsulation layer 200 may be formed by forming the buffer layer 210 by repeating operations of depositing a precursor layer above the display substrate 100 (S20) and forming one sub-layer 222 by curing the deposited precursor layer (S30), and then by forming the barrier layer 220 above the buffer layer 210 (S40).

The precursor layer may be formed by injecting a raw gas and a reaction gas into a chamber in which the display substrate 100 is located, and performing plasma-enhanced chemical vapor deposition (PECVD). The raw gas may be hexamethyldisiloxane, and the reaction gas may be oxygen or hydrogen; however, embodiments of the present invention are not limited thereto. In an embodiment, the raw gas may be hexamethyldisilazane, tetraethoxysilane, tetramethylcyclotetrasiloxane, octamethylcyclotetrasiloxane, tetramethylsilane, tetramethyldisiloxane, and/or the like.

As an example, when hexamethyldisiloxane is used as the raw gas and oxygen is used as the reaction gas, hexamethyldisiloxane is decomposed on a monomer basis and then a precursor layer having composition of SiOxCyHz may be deposited as described below.

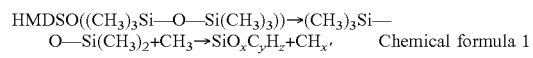

$$\text{HMDSO}((CH_3)_3Si\text{—}O\text{—}Si(CH_3)_3)) \rightarrow (CH_3)_3Si\text{—}O\text{—}Si(CH_3)_2 + CH_3 \rightarrow SiO_xC_yH_z + CH_{x'} \quad \text{Chemical formula 1}$$

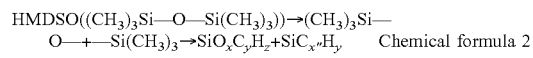

$$\text{HMDSO}((CH_3)_3Si\text{—}O\text{—}Si(CH_3)_3)) \rightarrow (CH_3)_3Si\text{—}O\text{—}+\text{—}Si(CH_3)_3 \rightarrow SiO_xC_yH_z + SiC_{x''}H_{y'} \quad \text{Chemical formula 2}$$

That is, when hexamethyldisiloxane is decomposed, a carbonate group and a methyl group are formed. In this case, as flux of oxygen, which is the reaction gas, increases, an oxidation reaction is dominant and the content of carbon inside the deposited precursor layer may reduce. When the content of carbon inside the precursor layer reduces, the formed sub-layer 222 may have properties close to an inorganic layer. Therefore, the properties of the sub-layer 222 may be adjusted by adjusting the flux of oxygen or replacing oxygen with nitrous oxide when depositing the precursor layer.

For example, to perform deposition to allow the precursor layer to fill a gap between the display substrate 100 and the thin film encapsulation layer 200 and to have adequate (e.g., excellent) step coverage, the flux of oxygen introduced into the chamber may be about 100 to about 20000 sccm; however, embodiments of the present invention are not limited thereto. The temperature, pressure, and flux of the raw gas and the reaction gas inside the chamber may be adjusted depending on the properties of the sub-layer 222 when depositing the precursor layer. For example, the flux of oxygen may increase as the number of stacks (e.g., as the number of times of stacking) of the sub-layers 222 increases. Therefore, an initially deposited precursor layer has improved liquidity and thus may effectively fill a gap between the step portion S and the display substrate 100.

After the precursor layer is deposited, the sub-layer 222 is formed by curing the precursor layer. The curing of the precursor layer may be performed by using hydrogen plasma, for example. In an embodiment, the curing of the precursor layer may be performed by using plasma of oxygen or an arbitrary gas.

The sub-layer 222 may have a thickness ranging from about 300 Å to about 10000 Å. When the sub-layer 222 has a thickness less than about 300 Å, because the hardness of the sub-layer 222 increases due to plasma curing, it may be difficult to distribute stress occurring in the barrier layer 220. When the sub-layer 222 has a thickness greater than about 10000 Å, the sub-layers 222 may have an uncured portion therein and have an excessively soft characteristic, so that wrinkles may occur in the sub-layer 222. The sub-layer 222 may be repeatedly formed a plurality of numbers of times. The plurality of stacked sub-layers 222 may form the buffer layer 210.

A difference between the thickness g21 at the outer portion of the step portion S and the thickness g22 at a location overlapping the step portion S in one sub-layer 222 may increase toward the display substrate 100, and gradually reduce as the sub-layers 222 are stacked. Therefore, initially stacked sub-layers 222 completely cover the surface of the step portion S and fill a gap between the step portion S and the display substrate 100. As the plurality of sub-layers 222 are stacked, a step difference (e.g., a step height) of the step portion S reduces and thus the surface of the buffer layer 210 may be planarized or substantially planarized. In this case, the formed buffer layer 210 has a first thickness T1 at a location spaced apart from the step portion S and a second thickness T2 at a location overlapping the step portion S. Here, the second thickness T2 may be about 0.5 times or more than and less than one times the thickness T1.

To do so, the sub-layer 222 may include about 20 to about 50 atomic % of silicon, about 10 to about 40 atomic % of oxygen, and about 30 to about 60 atomic % of carbon based on a total number of atoms of the silicon, the oxygen, and the carbon. In an embodiment, the sub-layer 222 may include about 30 to about 40 atomic % of silicon, about 18 to about 28 atomic % of oxygen, and about 40 to about 50 atomic % of carbon. In an embodiment, the sub-layer 222 may include about 33 to about 36 atomic % of silicon, about 20 to about 23 atomic % of oxygen, and about 42 to about 45 atomic % of carbon. The sub-layer 222 having the above composition may have a Young's modulus ranging from about 2 to about 3 GPa.

FIG. 6 illustrates that the buffer layer 210 surrounds a particle P having a circular cross-section. When the buffer layer 210 has the above composition, as illustrated in FIG. 6, the buffer layer 210 completely surrounds the particle P. Therefore, even where a contact angle between the particle P and the display substrate 100 forms an acute angle, an air gap is not generated below the particle P and a step difference caused by the particle P reduces, so that stress applied to the barrier layer 220 formed above the buffer layer 210 may reduce.

The plurality of sub-layers 222 may include the first region 223 and the second region 224 directly exposed to plasma during a curing process. The second region 224 is a region in which a content ratio of carbon is reduced by the plasma, and may have properties close to an inorganic layer compared to the first region 223. Therefore, because the buffer layer 210 has a structure in which the first region 223 and the second region 224 having different properties have a small thickness and are multi-layered, moisture and oxygen-blocking characteristics improve and excellent flexibility may be maintained.

The barrier layer 220 may be formed by using the same method of forming the buffer layer 210 inside the chamber. Therefore, when the thin film encapsulation layer 200 is formed, tact time may reduce.

Figure 7:
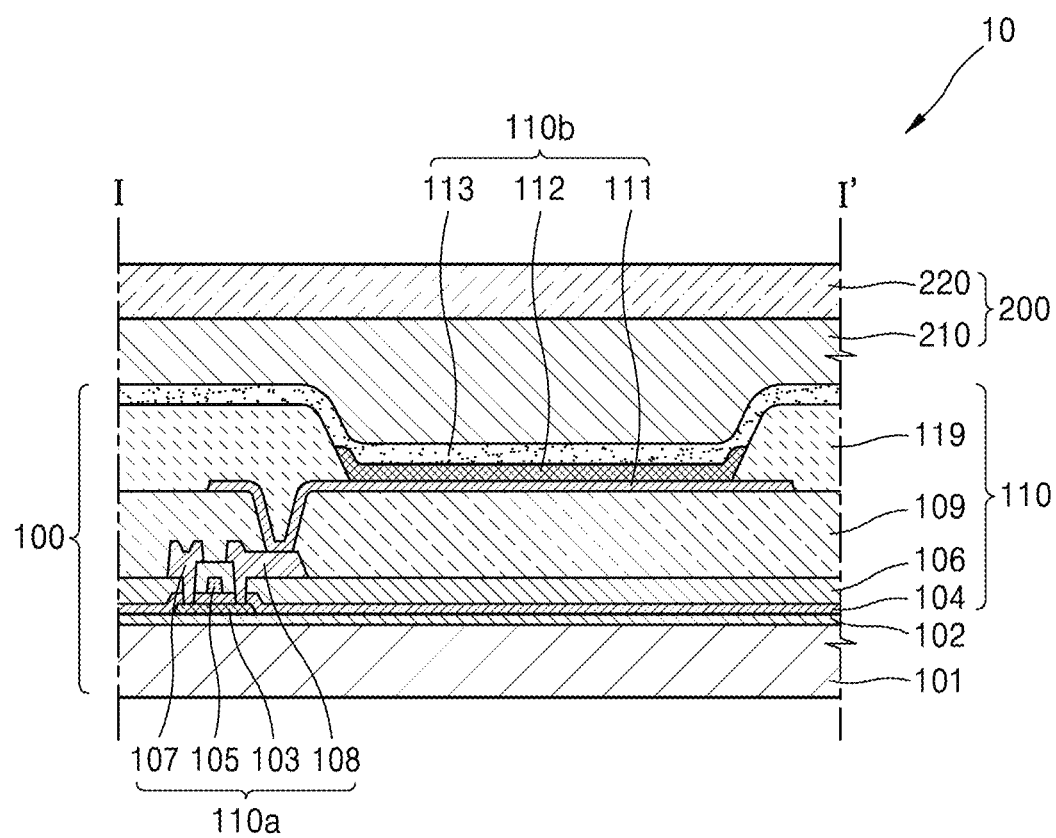
FIG. 7 is a cross-sectional view illustrating another example of the portion of the display device taken along the line I-I' of FIG. 1.

FIG. 7 is a cross-sectional view illustrating another example of the portion of the display device 10 taken along the line I-I' of FIG. 1.

Referring to FIG. 7, the display device 10 may include the display substrate 100 and the thin film encapsulation layer 200 above the display substrate 100. The thin film encapsulation layer 200 may include the buffer layer 210 and the barrier layer 220. The thin film encapsulation layer 200 may prevent or substantially prevent external oxygen and moisture from penetrating into the display portion 110 by sealing the display portion 110. Because the buffer layer 210 and the barrier layer 220 are the same or substantially the same as those described with reference to FIGS. 1 to 6, descriptions thereof may not be repeated.

The display substrate 100 may include the base substrate 101 and the display portion 110 above the base substrate 101. The display portion 110 may include a display element 110b and a thin film transistor (TFT) 110a electrically connected to the display element 110b. Though an example in which the display element 110b includes an organic emission layer is described below, embodiments of the present invention are not limited thereto, and the display element 110b may include various suitable kinds of display elements such as a light-emitting diode (LED), an liquid crystal, and/or the like.

The base substrate 101 may include various suitable materials. For example, the base substrate 101 may include a transparent glass material including $SiO_2$ as a main component. However, the base substrate 101 is not limited thereto and may include a transparent plastic material. The plastic material may include an organic material including polyethersulfone (PES), polyarylate (PAR), polyetherimide (PEI), polyethylen naphthalate (PEN), polyethyleneterepthalate (PET), polyphenylene sulfide (PPS), polyallylate, polyimide, polycarbonate (PC), cellulose triacetate (TAC), cellulose acetate propionate (CAP), and/or the like.

A buffer layer 102 may be formed above the base substrate 101. For example, the buffer layer 102 may include an inorganic material, such as silicon oxide, silicon nitride, silicon oxynitride, aluminum oxide, aluminum nitride, titanium oxide, titanium nitride and/or the like, and/or an organic material, such as polyimide, polyester, and acryl, and/or the like, and may include a plurality of stacked materials from among the above materials.

The TFT 110a may include an active layer 103, a gate electrode 105, a source electrode 107, and a drain electrode 108. A case where the TFT 110a is a top gate-type TFT in which the active layer 103, the gate electrode 105, the source electrode 107, and the drain electrode 108 are sequentially formed in this stated order is described below. However, embodiments of the present invention are not limited thereto, and various suitable types of TFTs 110a, such as a bottom type TFT, may be employed.

The active layer 103 includes a semiconductor material and may include, for example, amorphous silicon, poly crystalline silicon, and/or the like. However, embodiments of the present invention are not limited thereto, and the active layer 103 may include various suitable materials. In an embodiment, the active layer 103 may include an organic semiconductor material. In another embodiment, the active layer 103 may include an oxide semiconductor material. For example, the active layer 103 may include Groups 12, 13, 14 metallic elements, such as Zn, In, Ga, Sn, Cd, Ge, and/or an oxide of a combination thereof.

A gate insulating layer 104 is formed above the active layer 103. The gate insulating layer 104 may include a single or multi-layer structure including an inorganic material, such as silicon oxide, silicon nitride, and/or the like. The gate insulating layer 104 insulates the active layer 103 from the gate electrode 105.

The gate electrode 105 is formed above the gate insulating layer 104. The gate electrode 105 may be connected to a gate line applying an on/off signal to the TFT 110a. The gate electrode 105 may include a low resistance metallic material. The gate electrode 105 may include a single or multi-layer structure including Al, Pt, Pd, Ag, Mg, Au, Ni, Nd, Ir, Cr, Li, Ca, Mo, Ti, W, and Cu, and/or the like.

An interlayer insulating layer 106 is formed above the gate electrode 105. The interlayer insulating layer 106 insulates the source electrode 107 and the drain electrode 108 from the gate electrode 105. The interlayer insulating layer 106 may include a single or multi-layer structure including an inorganic material. For example, the inorganic material may include metallic oxide or metallic nitride. For example, the inorganic material may include $SiO_2$, SiNx, SiON, $Al_2O_3$, $TiO_2$, $Ta_2O_5$, $HfO_2$, $ZrO_2$, and/or the like.

The source electrode 107 and the drain electrode 108 are formed above the interlayer insulating layer 106. The source electrode 107 and the drain electrode 108 may each include a single or multi-layer structure including Al, Pt, Pd, Ag, Mg, Au, Ni, Nd, Ir, Cr, Li, Ca, Mo, Ti, W, Cu, and/or the like. The source electrode 107 and the drain electrode 108 contact regions of the active layer 103.

A passivation layer 109 may cover the TFT 110a. The passivation layer 109 resolves a step difference originated from the TFT 110a, planarizes the upper surface thereof, and thus prevents or substantially prevents a defect from occurring to the display element 110b due to lower irregularities.

The passivation layer 109 may include a single or multi-layer structure including an organic material. The organic material may include a general purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. Also, the passivation layer 109 may include a composite stacked layer of an inorganic insulating layer and an organic insulating layer.

The display element 110b is formed above the passivation layer 109. The display element 110b includes a first electrode 111, a second electrode 113 facing the first electrode 111, and an intermediate layer 112 between the first electrode 111 and the second electrode 113.

The first electrode 111 may be electrically connected to the drain electrode 108. The first electrode 111 may have various suitable shapes and, for example, may be patterned in an island shape.

The first electrode 111 may be formed above the passivation layer 109 and electrically connected to the TFT 110a via a contact hole formed in the passivation layer 109. The first electrode 111 may be, for example, a reflective electrode. For example, the first electrode 111 may include a reflective layer including Ag, Mg, Al, Pt, Pd, Au, Ni, Nd, Ir, Cr, and/or a compound thereof, and a transparent electrode layer formed above the reflective layer. The transparent electrode layer may include indium tin oxide (ITO), indium zinc oxide (IZO), zinc oxide (ZnO), $In_2O_3$ (indium oxide), indium gallium oxide (IGO), aluminum zinc oxide (AZO), and/or the like.

The second electrode 113 facing the first electrode 111 may be a transparent electrode and may include a metallic thin film having a small work function and including Li, Ca, LiF/Ca, LiF/Al, Al, Ag, Mg, and/or the like, and a compound thereof. Also, an auxiliary electrode layer or a bus electrode may be further formed by using ITO, IZO, ZnO, or, $In_2O_3$, and/or the like above the metallic thin film. Therefore, the second electrode 113 may transmit light emitted from the organic emission layer included in the intermediate layer 112. That is, light emitted from the organic emission layer may be directly emitted toward the second electrode 113 or reflected by the first electrode 111 including the reflective electrode and emitted toward the second electrode 113.

However, the display portion 110 according to an embodiment is not limited to a top-emission type display portion, and may be a bottom-emission type display portion that emits light emitted from an organic emission layer toward the base substrate 101. In this case, the first electrode 111 may include a transparent electrode, and the second electrode 113 may include a reflective electrode. Also, the display portion 110 according to an embodiment may be a dual-emission type display portion that emits light in a dual direction including the top direction and the bottom direction.

A pixel-defining layer 119 including an insulating material is formed above the first electrode 111. The pixel-defining layer 119 may include at least one of an organic insulating material including polyimide, polyamide, an acryl resin, benzocyclobutene (BCB), and/or the like, and a phenol resin, and may be formed by using a method such as spin coating. The pixel-defining layer 119 exposes a set or predetermined region of the first electrode 111, and the intermediate layer 112 including the organic emission layer is located in the exposed region. That is, the pixel-defining layer 119 defines a pixel region of an organic light-emitting device. The pixel-defining layer 119 may be the step portion S (see, e.g., FIG. 2) illustrated in, and described in reference to, FIGS. 1 to 6, and the buffer layer 210 may reduce a step difference by the pixel-defining layer 119.

The organic emission layer included in the intermediate layer 112 may include a low molecular organic material or a polymer organic material and selectively further include a functional layer, such as a hole transport layer (HTL), a hole injection layer (HIL), an electron transport layer (ETL), and an electron injection layer (EIL), in addition to the organic emission layer.

Figure 8:
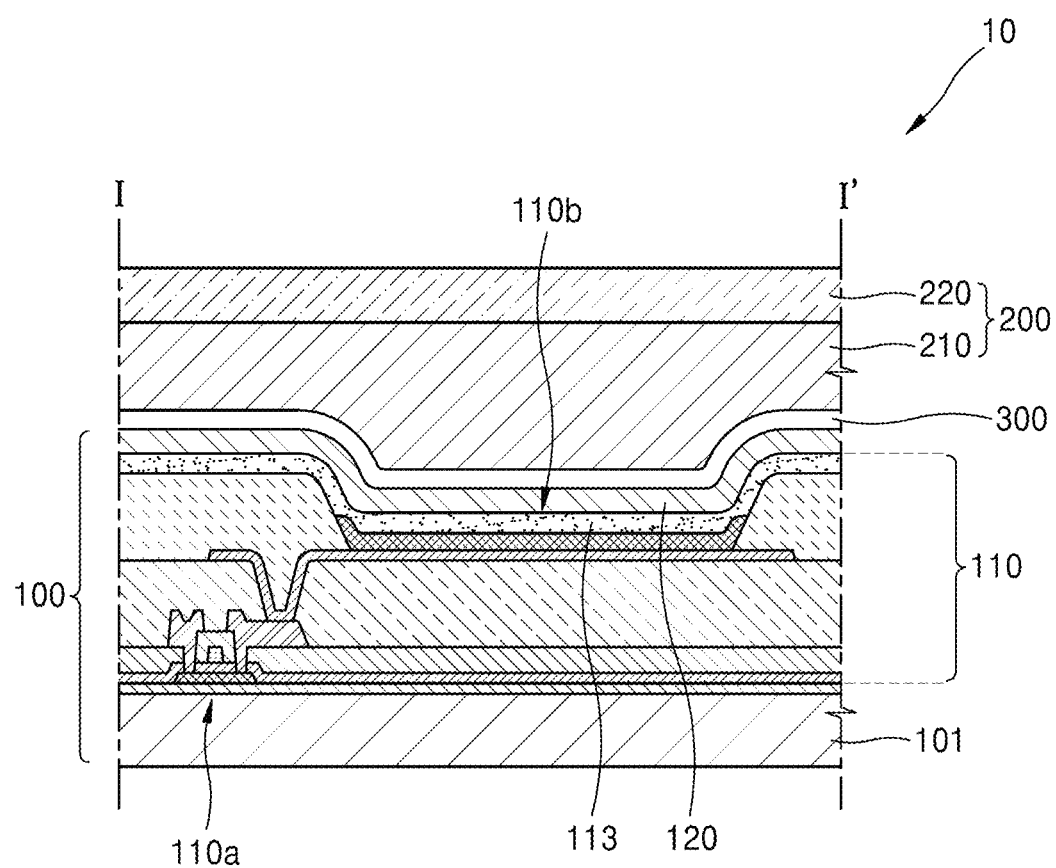
FIG. 8 is a cross-sectional view illustrating another example of the portion of the display device taken along the line I-I' of FIG. 1.

FIG. 8 is a cross-sectional view illustrating another example of the portion of the display device 10 taken along the line I-I' of FIG. 1.

Referring to FIG. 8, the display device 10 may include the display substrate 100, and the thin film encapsulation layer 200 above the display substrate 100.

The display substrate 100 may include a base substrate 101 and the display portion 110 above the base substrate 101. The display portion 110 may include the TFT 110a and the display element 110b. Also, the thin film encapsulation layer 200 prevents or substantially prevents external oxygen, moisture, and/or the like from penetrating into the display portion 110 by sealing the display portion 110 and may include the buffer layer 210 and the barrier layer 220.

Because the thin film encapsulation layer 200 of the display portion 110 is the same or substantially the same as that illustrated in and described with reference to FIGS. 1 to 7, description thereof may not be repeated.

Referring to FIG. 8, the display device 10 may further include a protective layer 300 above the display portion 110. The display substrate 100 may further include a capping layer 120 between the protective layer 300 and the second electrode 113 of the display element 110b.

The protective layer 300 may include the same or substantially the same material as that of the buffer layer 210. That is, the protective layer 300 may include silicon oxide including carbon and hydrogen. For example, the plurality of sub-layers 222 may include a material having a composition formula of SiOxCyHz. However, the protective layer 300 may have properties closer to an inorganic layer compared to the buffer layer 210. For example, the protective layer 300 may include content of oxygen greater than that of the buffer layer 210 and include content of carbon less than that of the buffer layer 210, and further include a silicon carbide to which hydrogen is coupled.

When the protective layer 300 has the properties of the inorganic layer as described above, an outgassing phenomenon reduces during a process of forming the protective layer 300, and thus the display element may be prevented or substantially prevented from being damaged by the emitted gas.

The protective layer 300 may be formed by using the same method as the method used for forming the buffer layer 210. That is, before the thin film encapsulation layer 200 is formed, a raw gas and a reaction gas are injected into the chamber in which the display substrate 100 is located, and the protective layer 300 may be formed by using the PECVD. In this case, to allow the protective layer 300 to have properties close to an inorganic layer, flux of oxygen, which is a reaction gas introduced into the chamber when forming the protective layer 300, may be greater than flux of oxygen introduced into the chamber when forming the buffer layer 210. Therefore, both the protective layer 300 and the thin film encapsulation layer 200 may be formed in one chamber by using the same method.

The capping layer 120 is formed above the second electrode 113 and protects the display element 110b, and assists light generated from the display element 110b so that the light may be efficiently emitted. For example, the capping layer 120 may include an organic material such as a-NPD, NPB, TPD, m-MTDATA, Alq$_3$, and/or CuPc. In this case, the capping layer 120 may have a refractive index ranging from about 1.6 to about 3.0. However, embodiments of the present invention are not limited thereto, and the capping layer 120 may include a material that may block moisture and/or oxygen.

The protective layer 300 including the same or substantially the same material as that of the buffer layer 210 may have a refractive index less than that of the capping layer 120. For example, the protective layer 300 may have a refractive index ranging from about 1.38 to about 1.5. When fluorine (F) is further added to the protective layer 300, the protective layer 300 may have a lower refractive index. When the protective layer 300 has a small refractive index as described above, extinction of light generated from the display element 110b during a process of being emitted to outside may be suppressed and thus light-extraction efficiency of the display device 10 may improve (e.g., increase).

Figure 9:
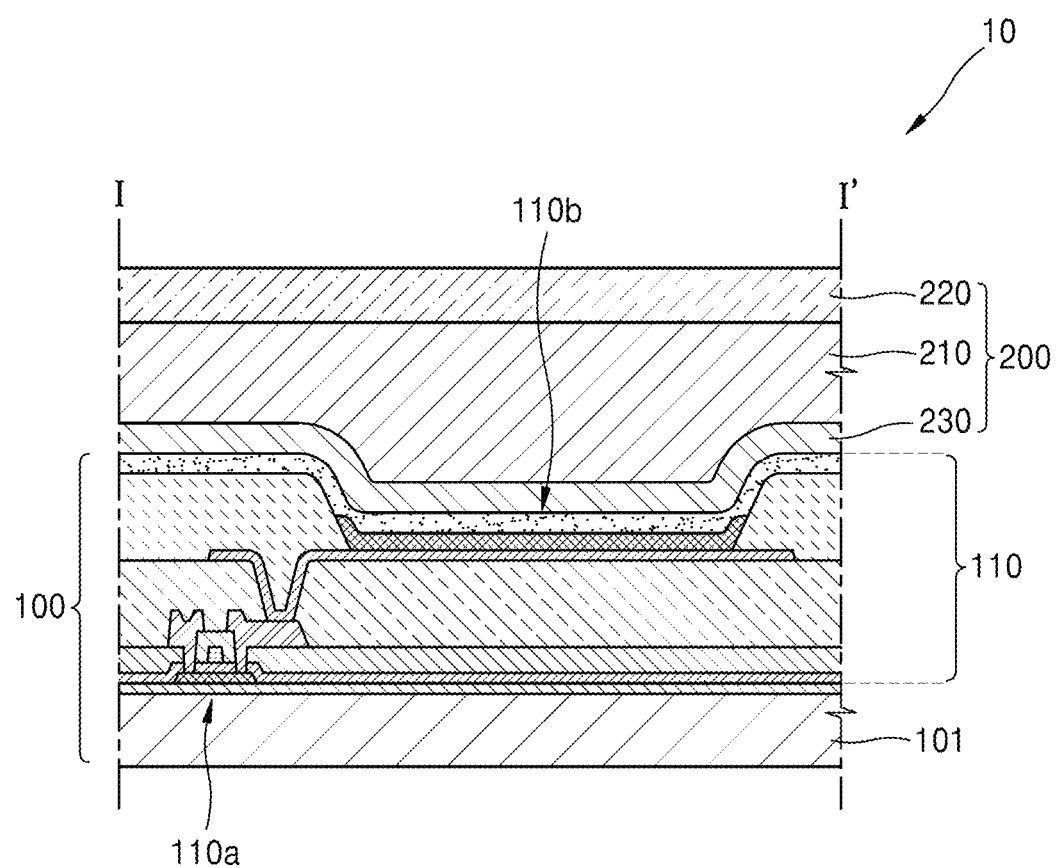
FIG. 9 is a cross-sectional view illustrating another example of the portion of the display device taken along the line I-I' of FIG. 1.
Figure 10:
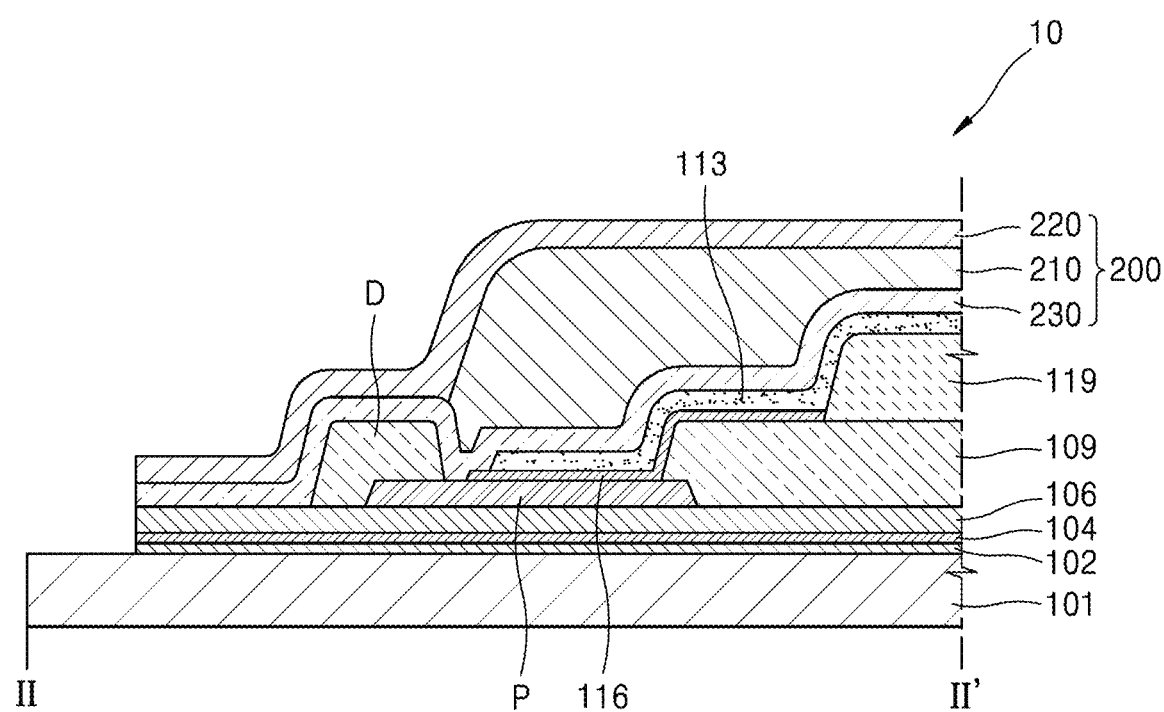
FIG. 10 is a cross-sectional view illustrating an example of a portion of the display device taken along the line II-II' of FIG. 1.

FIG. 9 is a cross-sectional view illustrating another example of the portion of the display device 10 taken along the line I-I' of FIG. 1; and FIG. 10 is a cross-sectional view illustrating an example of a portion of the display device 10 taken along the line II-II' of FIG. 1.

Referring to FIGS. 9 and 10, the display device 10 may include the display substrate 100 and the thin film encapsulation layer 200 above the display substrate 100.

The display substrate 100 may include the base substrate 101 and the display portion 110 above the base substrate 101. The display portion 110 may include the TFT 110a and the display element 110b. Because the display portion 110 is the same or substantially the same as that described with reference to FIG. 7, description thereof may not be repeated.

The thin film encapsulation layer 200 seals the display portion 110, and may include a first barrier layer 230, the buffer layer 210, and a second barrier layer 220 that are sequentially stacked.

The buffer layer 210 may include about 20 to about 50 atomic % of silicon, about 10 to about 40 atomic % of oxygen, and about 30 to about 60 atomic % of carbon based on a total number of atoms of silicon, oxygen, and carbon. Also, in an embodiment, the buffer layer 210 may include about 30 to about 40 atomic % of silicon, about 18 to about 28 atomic % of oxygen, and about 40 to about 50 atomic % of carbon. In an embodiment, the buffer layer 210 may include about 33 to about 36 atomic % of silicon, about 20 to about 23 atomic % of oxygen, and about 42 to about 45 atomic % of carbon. Therefore, the buffer layer 210 may reduce a step difference (e.g., a step height) formed by the pixel-defining layer 119 and prevent or substantially prevent an air gap from being formed between the step difference and the thin film encapsulation layer 200.

The second barrier layer 220 may include silicon nitride, aluminum nitride, zirconium nitride, titanium nitride, hafnium nitride, tantalum nitride, silicon oxide, aluminum oxide, titanium oxide, tin oxide, cesium oxide, silicon oxynitride (SiON), and/or the like.

For example, the first barrier layer 230 may include the same or substantially the same material as that of the second barrier layer 220.

In another embodiment, the first barrier layer 230 may include the same or substantially the same material as that of the buffer layer 210. In the case where the first barrier layer 230 includes the same or substantially the same material as that of the buffer layer 210, the first barrier layer 230 may include the greater amount of an inorganic material than that of the buffer layer 210. The first barrier layer 230 and the buffer layer 210 may be successively formed inside the same chamber by using the same deposition method. However, when depositing the first barrier layer 230, the hardness of the first barrier layer 230 may improve (e.g., increase) by increasing the flux of oxygen (which is a reaction gas), as compared to the deposition of the buffer layer 210.

As illustrated in FIG. 10, the first barrier layer 230 and the second barrier layer 220 may extend further than the buffer layer 210 and may contact each other at the outer portion of the buffer layer 210. Also, at least one of the first barrier layer 230 and the second barrier layer 220 may contact the gate insulating layer 104 and the interlayer insulating layer 106 at the outer portion of the buffer layer 210. Therefore, transmission of external moisture via the lateral side may be prevented or substantially prevented, and adhesive force of the thin film encapsulation layer 200 may improve (e.g., increase).

Also, the display substrate 100 may further include a dam D at the edge of the base substrate 101. The dam D may be formed in a non-display area, which is outside of the display area in which the display element 110b is disposed. A voltage line P may be disposed in the non-display area and connected to the second electrode 113 via a wiring 116. However, embodiments of the present invention are not limited thereto, and the voltage line P may directly contact the second electrode 113.

The dam D may include the same or substantially the same material as that of at least one of layers including the gate insulating layer 104 to the pixel-defining layer 119. The dam D may overlap and contact at least the outer edge of the voltage line P including a metallic material. Therefore, the dam D that includes an organic material having excellent adhesive force with respect to metal compared to an inorganic material may be stably formed with excellent adhesive force.

The dam D may include a single layer or a plurality of layers. For example, the dam D may include a first layer including the same or substantially the same material as that of the passivation layer 109 and a second layer including the same or substantially the same material as that of the pixel-defining layer 119 above the first layer. Also, the dam D may be provided in the plural. In the case where the dam D is provided in the plural, the height of the dam D may increase toward the outer portion of the base substrate 101.

The dam D may prevent or substantially prevent the buffer layer 210 from being formed up to the edge of the base substrate 101. Because the precursor layer for forming the buffer layer 210 may have liquidity to some degree, the dam D may prevent or substantially prevent the edge tail of the buffer layer 210 from being formed by blocking the precursor layer flowing toward the edge of the base substrate 101. Therefore, the buffer layer 210 may face or contact the inner surface of the dam D. For another example, the buffer layer 210 may overlap a portion of the dam D but does not extend outside the dam D.

However, the first barrier layer 230 and the second barrier layer 220 may cover the dam D. When the second barrier layer 220 includes the same or substantially the same material as that of the buffer layer 210, the second barrier layer 220 includes many characteristics of an inorganic layer compared to the buffer layer 210 and thus is formed conformally. Therefore, the liquidity of a precursor layer for forming the second barrier layer 220 is not problematic.

The first barrier layer 230 and the second barrier layer 220 may contact each other at the outer portion of the dam D. Also, at least one of the first barrier layer 230 and the second barrier layer 220 may contact the gate insulating layer 104 or the interlayer insulating layer 106 at the outer portion of the dam D. Therefore, transmission of external moisture via the lateral side may be prevented or substantially prevented and adhesive force of the thin film encapsulation layer 200 may improve (e.g., increase).

The display device 10 illustrated in FIGS. 9 and 10 may further include the protective layer 300 (see, e.g., FIG. 8) and the capping layer 120 (see, e.g., FIG. 8) illustrated in and described in reference to FIG. 8.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

Though the inventive concept has been described with reference to the embodiments illustrated in the drawings, this is merely exemplary, and it will be understood by those of ordinary skill in the art that various suitable changes in form and details and equivalents thereof may be made therein without departing from the spirit and scope of the inventive concept as defined by the following claims, and equivalents thereof.

What is claimed is:

1. A display device comprising:
a display substrate comprising at least one step portion; and
a thin film encapsulation layer above the display substrate, the thin film encapsulation layer comprising a buffer layer, and
the buffer layer comprising a plurality of sub-layers and interfaces between the plurality of sub-layers, each one of the sub-layers comprising a first portion and a second portion between the first portion and the display substrate, a carbon content of each one of the sub-layers gradually increasing from the first portion toward the second portion,
wherein each of the plurality of sub-layers comprises about 20 to about 50 atomic % of silicon, about 10 to about 40 atomic % of oxygen, and about 30 to about 60 atomic % of carbon based on a total number of atoms of the silicon, the oxygen, and the carbon, and each of the plurality of sub-layers having a Young's modulus from about 2 to about 3 GPa.

2. The display device of claim 1, wherein each of the plurality of sub-layers has a thickness from about 300 Å to about 10000 Å.

3. The display device of claim 1, wherein an interval between two adjacent interfaces of the interfaces reduces toward a portion overlapping the step portion from an outer portion of the step portion.

4. The display device of claim 1, wherein the buffer layer has a first thickness at a location spaced from the step portion and has a second thickness at a location overlapping the step portion, and wherein the second thickness is less than the first thickness and greater than or equal to 0.5 times the first thickness.

5. The display device of claim 1, wherein an upper surface of the first portion forms an interface of the interfaces, and wherein the first portion has a silicon content ratio greater than that of the second portion, and the first portion has a carbon content ratio less than that of the second portion.

6. The display device of claim 5, wherein each of the plurality of sub-layers comprises about 30 to about 40 atomic % of the silicon, about 18 to about 28 atomic % of the oxygen, and about 40 to about 50 atomic % of the carbon based on the total number of atoms of the silicon, the oxygen, and the carbon.

7. The display device of claim 5, wherein each of the plurality of sub-layers comprises about 33 to about 36 atomic % of the silicon, about 20 to about 23 atomic % of the oxygen, and about 42 to about 45 atomic % of the carbon based on the total number of atoms of the silicon, the oxygen, and the carbon.

8. The display device of claim 1, wherein the display substrate comprises a base substrate and a display portion above the base substrate,
wherein the display portion comprises a plurality of display elements and a pixel-defining layer defining a light-emitting region of the plurality of display elements, and
wherein the at least one step portion comprises the pixel-defining layer.

9. The display device of claim 8, further comprising a protective layer above the display portion, the protective layer comprising a same material as that of the buffer layer.

10. The display device of claim 9, wherein each of the plurality of display elements comprises a first electrode, a second electrode, and an intermediate layer between the first and second electrodes, the intermediate layer comprising an organic emission layer, and
wherein the display substrate further comprises a capping layer between the first electrode and the protective layer, the capping layer having a refractive index greater than that of the protective layer.

11. The display device of claim 10, wherein the protective layer has a refractive index from about 1.38 to about 1.5.

12. The display device of claim 9, wherein the protective layer further comprises silicon carbide to which hydrogen is coupled.

13. The display device of claim 8, wherein the thin film encapsulation layer further comprises a barrier layer above the buffer layer.

14. The display device of claim 13, wherein the thin film encapsulation layer is configured to seal the display portion,
wherein the barrier layer comprises a first barrier layer and a second barrier layer overlapping each other with the buffer layer therebetween, and
wherein the first and second barrier layers comprise an inorganic layer.

15. The display device of claim 14, wherein the first and second barrier layers contact each other at an outer portion of the buffer layer.

* * * * *